United States Patent
Nakamura

(10) Patent No.: US 12,433,038 B2
(45) Date of Patent: Sep. 30, 2025

(54) SOLAR BATTERY MODULE

(71) Applicant: KANEKA CORPORATION, Osaka (JP)

(72) Inventor: Junichi Nakamura, Settsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 18/784,393

(22) Filed: Jul. 25, 2024

(65) Prior Publication Data
US 2024/0405138 A1  Dec. 5, 2024

Related U.S. Application Data

(63) Continuation of application No. PCT/JP2022/048220, filed on Dec. 27, 2022.

(30) Foreign Application Priority Data

Jan. 28, 2022 (JP) .................................. 2022-011786

(51) Int. Cl.
  *H10F 19/40*  (2025.01)
  *H10F 19/85*  (2025.01)
(52) U.S. Cl.
  CPC ............. *H10F 19/40* (2025.01); *H10F 19/85* (2025.01)
(58) Field of Classification Search
  CPC .......... H10F 19/00; H10F 19/40; H10F 19/85; H10F 19/90
  See application file for complete search history.

(56) References Cited

U.S. PATENT DOCUMENTS

| 10,770,610 B2 * | 9/2020 | Sethi | H10F 19/906 |
| 2009/0145479 A1 * | 6/2009 | Williams | H10F 77/488 |
| | | | 136/256 |
| 2017/0125619 A1 | 5/2017 | Nakano et al. | |

(Continued)

FOREIGN PATENT DOCUMENTS

| CN | 212725330 U | 3/2021 |
| EP | 3731282 A1 | 10/2020 |
| JP | 2017-517145 A | 6/2017 |

(Continued)

OTHER PUBLICATIONS

International Search Report issued in PCT/JP2022/048220; mailed Mar. 20, 2023.

*Primary Examiner* — Golam Mowla
(74) *Attorney, Agent, or Firm* — Studebaker Brackett PLLC

(57) ABSTRACT

A solar battery module capable of suppressing a large load from being applied on a cut end section of a solar battery cell. This solar battery module has a curved surface shape and comprises flat solar battery cells arranged using a singling method. Each of the solar battery cells is a half-cut cell obtained by cutting a predetermined-sized substrate into two pieces, has a cut end section and a non-cut end section as two end sections facing each other in the arrangement direction of the solar battery cells, and has, as two main surfaces, a convex-side main surface on the convex side of a curved surface of the solar battery module and a concave-side main surface on the concave side of the curved surface of the solar battery module. The solar battery cells adjacent to each other overlap.

2 Claims, 3 Drawing Sheets

(56) References Cited

U.S. PATENT DOCUMENTS

2018/0158970 A1    6/2018  Yoon et al.
2018/0358493 A1*  12/2018  Iwamoto ................. B60L 8/003

FOREIGN PATENT DOCUMENTS

| | | |
|---|---|---|
| JP | 2018-093167 A | 6/2018 |
| JP | 2019-033302 A | 2/2019 |
| JP | 2021-100088 A | 7/2021 |
| WO | 2015/152020 A1 | 10/2015 |
| WO | 2019/146366 A1 | 8/2019 |

* cited by examiner

SOLAR BATTERY MODULE

CROSS-REFERENCE TO RELATED APPLICATIONS

This application claims benefit of priority to International Patent Application No. PCT/JP2022/048220, filed Dec. 27, 2022, and to Japanese Patent Application No. 2022-011786, filed Jan. 28, 2022, the entire contents of each are incorporated herein by reference.

BACKGROUND

Technical Field

The present disclosure relates to a solar cell module.

Background Art

Recently, as a method of modularizing solar cells, there is a method including overlapping portions of solar cells, thereby directly, electrically and physically connecting the solar cells. Such a connection method is called a shingling method and a plurality of solar cells electrically connected by a shingling method is called a solar cell string as described, for example, in Japanese Unexamined Patent Application, Publication No. 2017-517145.

The solar cell string allows more solar cells to be mounted on a limited area in a solar cell module, which increases a light receiving area for photoelectric conversion and improves output of the solar cell module. Moreover, the solar cell string has no space between solar cells, which improves the design of the solar cell module.

In addition, in such a solar cell module, a technique is known where a half-cut solar cell obtained by cutting a large-sized semiconductor wafer of a predetermined size (for example, a 6-inch semi-square shape) into two pieces is used. This can reduce current capacity per string connected in series, resulting in reduction in current loss.

Further, a technique of arranging such solar cell modules on a curved surface of a vehicle, a building, or the like is known as described, for example, in Japanese Unexamined Patent Application, Publication No. 2019-33302. In such a solar cell module, a plurality of solar cells are arranged along a curved surface in a matrix-like form.

SUMMARY

When flat solar cells are arranged on a curved surface in a shingling structure, in the overlapping portions of the solar cells, the solar cells do not contact by surface contact, but contact locally on an edge alone, resulting in an increased thickness. Therefore, in a sealing process, a relatively large load (local pressurizing stress) is applied to an edge of a contact end of an overlapping portion of a solar cell. In addition, in a half-cut solar cell, the cut end has been damaged by laser irradiation and includes potential microcracks, which easily lead to breakage.

Therefore, when half-cut flat solar cells are arranged into a curved surface shape in the shingling structure, only an edge of the cut end of the solar cell is locally in contact and a relatively large load (local pressurizing stress) is applied to the cut end in the sealing process, resulting in breakage of the solar cells in some cases.

Accordingly, the present disclosure provides a solar cell module that can suppress a large load from being applied to a cut end of a solar cell even in a curved solar cell module.

A solar cell module according to the present disclosure is a curved solar cell module, including a plurality of flat solar cells arranged by the shingling method. Each of the plurality of solar cells is a half-cut cell obtained by cutting a substrate of a predetermined size into two pieces. Each of the solar cells has a cut end and a non-cut end as two opposing ends in an arrangement direction of the plurality of solar cells. Each of the solar cells has, as two main surfaces, a convex-side main surface on a convex side of a curved surface of the solar cell module and a concave-side main surface on a concave side of the curved surface of the solar cell module. Adjacent solar cells among the plurality of solar cells are overlapped such that an edge of the non-cut end of one of the solar cells on the convex-side main surface side is in contact with the concave-side main surface of the other solar cell on the cut end side.

According to the present disclosure, even in a curved solar cell module, it is possible to suppress a large load from being applied to the cut end of the solar cell.

DETAILED DESCRIPTION

Hereinafter, an example according to an embodiment of the present disclosure will be described with reference to the accompanying drawings. Throughout the drawings, the same reference signs are used to indicate the same or corresponding components. In some drawings, hatching, reference signs, or the like are omitted for the sake of simplicity, and in a such a case, other drawings shall be referenced.

Figure 1:
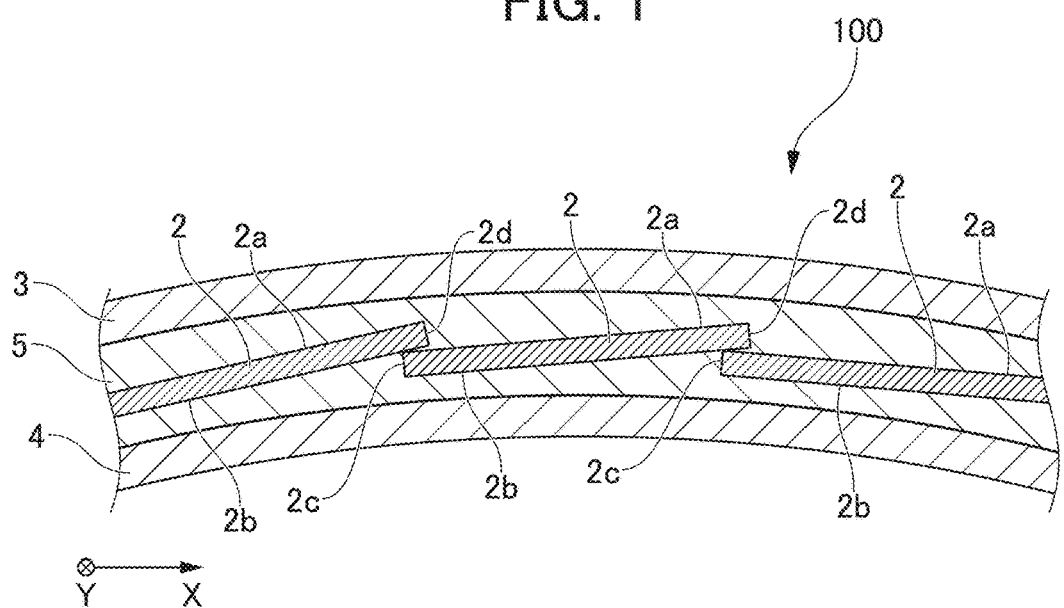
FIG. 1 is a cross-sectional view showing a solar cell module according to the present embodiment.
Figure 2:
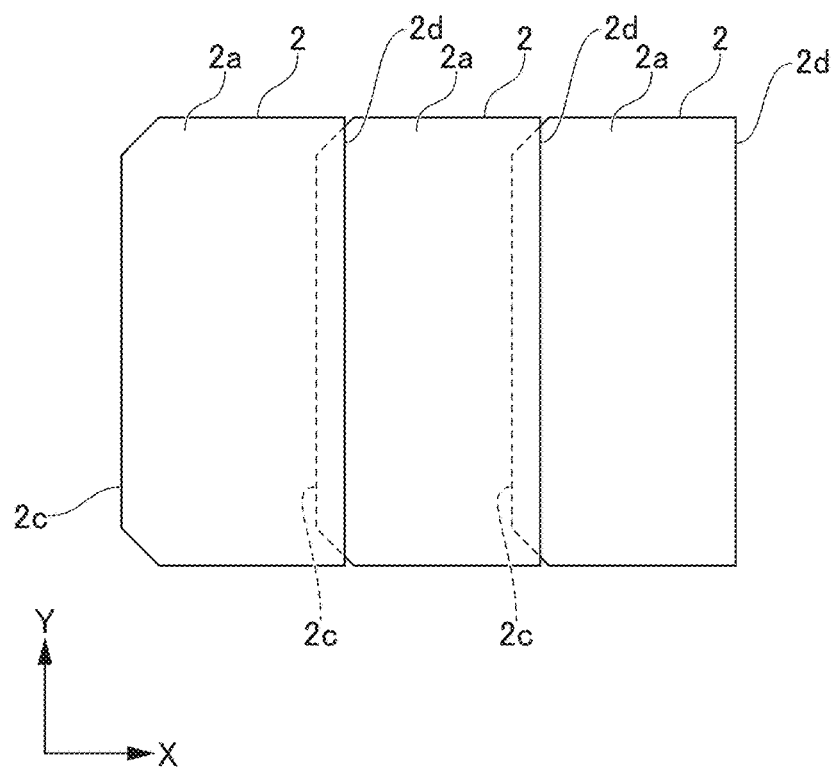
FIG. 2 is a plan view illustrating arrangement of solar cells in the solar cell module illustrated in FIG. 1 from a light receiving surface side.

FIG. 1 is a cross-sectional view of a solar cell module according to the present embodiment, and FIG. 2 is a plan view of the solar cell in the solar cell module illustrated in FIG. 1, from the light receiving surface side. The solar cell module 100 shown in FIGS. 1 and 2 is a curved solar cell module that is mounted on a curved surface of a vehicle, a building, or the like. The solar cell module 100 includes a plurality of solar cells 2 arranged along the curved surface. The arrangement of the solar cells 2 will be described later.

The solar cell 2 is disposed between a light receiving side-protection member 3 and a back side-protection member 4. A liquid or solid sealant 5 is filled between the light receiving side protection member 3 and the back side-protection member 4 to seal the solar cell 2.

The sealant 5 seals and protects the solar cells 2, and is provided between surfaces of the solar cells 2 on the light receiving side and the light receiving side-protection member 3, and between surfaces of the solar cells 2 on the back side and the back side-protection member 4. The shape of the sealant 5 is not particularly limited, and examples thereof include a sheet shape. This is because a sealant in the form of sheet can easily cover the top and bottom surfaces of planar solar cells 2.

Material of the sealant 5 is not particularly limited, but preferably has a property of transmitting light (light transmitting property). The material of the sealant 5 preferably has adhesiveness capable of bonding the solar cells 2, the light receiving side-protection member 3, and the back side-protection member 4. Examples of such a material include an optically transparent resin, such as an ethylene-vinyl acetate copolymer (EVA), an ethylene-α-olefin copolymer, an ethylene-vinyl acetate-triallyl isocyanurate copolymer (EVAT), polyvinyl butyrate (PVB), an acrylic resin, an urethane resin, or a silicone resin.

The light receiving side-protection member 3 covers a surface (light-receiving surface) of the solar cells 2 via the sealant 5, and protects the solar cells 2. A shape of the light receiving side-protection member 3 is not particularly limited, but is preferably a plate shape or a sheet shape, from the viewpoint of indirectly covering the planar light-receiving surface.

A material of the light receiving side-protection member 3 is not particularly limited, but is, likewise to the sealant 5, preferably a transparent and ultraviolet-resistant material, such as glass or a transparent resin such as an acrylic or polycarbonate resin can be exemplified. A surface of the light receiving side-protection member 3 may be processed so as to have an uneven shape or may be covered with an antireflection coating layer. This is because such an uneven surface renders the light receiving side-protection member 3 less likely to reflect the received light, guiding more light into the solar cells 2.

The back side-protection member 4 covers the back surface of the solar cells 2 via the sealant 5, and protects the solar cells 2. Shape of the back side-protection member 4 is not particularly limited, but is preferably in the form of plate or sheet from the viewpoint that the planar back surface can be indirectly covered, like the light receiving side-protection member 3.

The material of the back side-protection member 4 is not particularly limited, but is preferably a material capable of preventing infiltration of water and the like (highly water-impermeable material). Examples of the material include a resin film such as polyethylene terephthalate (PET), polyethylene (PE), an olefin-based resin, a fluorine-containing resin, or a silicone-containing resin, or a laminate of a plate-like resin material having translucency such as glass, polycarbonate, or an acrylic resin, and a metal foil such as an aluminum foil.

The arrangement of the solar cells 2 in the solar battery module 100 will be described below.

The solar cell 2 is a back electrode type (also referred to as a back junction type or a back contact type) cell and is a flat solar cell. The solar cell 2 is not limited thereto, and may be a double-sided electrode type (also referred to as a double-sided junction type) cell. The back electrode type cell can increase output of the solar cell module as compared with the double-sided electrode type cell and also can improve design of the solar cell module.

Figure 3:
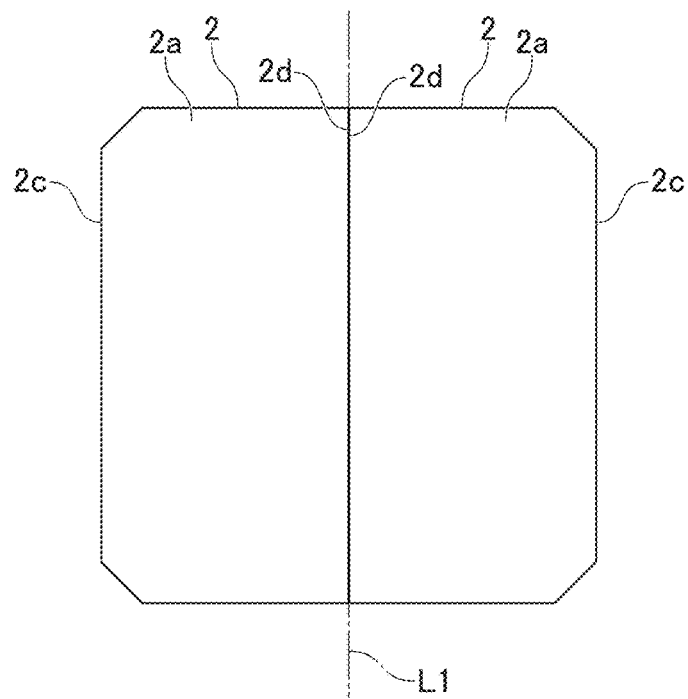
FIG. 3 is a schematic diagram showing a large-sized semiconductor wafer of a predetermined size and a half-cut solar cell.

As shown in FIG. 3, the solar cell 2 is a half-cut cell obtained by cutting a large-sized semiconductor wafer of a predetermined size (for example, a 6-inch semi-square shape) into two pieces.

The solar cell 2 has a cut end 2d and a non-cut end 2c as two ends that are opposite to each other in the arrangement direction of the solar cells (X direction: first direction). The solar cell 2 has, as two main surfaces, a convex-side main surface 2a closer to a convex side of the curved surface of the solar cell module 100, and a concave-side main surface 2b closer to a concave side of the curved surface of the solar cell module 100.

The solar cells 2 are arranged in the X direction (first direction) so that the ends partially overlap each other. In this way, since the plurality of solar cells 2 have a stacked structure in which the solar cells 2 are uniformly inclined in a certain direction like tiles on a roof, the method of arranging the solar cells 2 in this manner is referred to as a shingling method. The plurality of solar cells 2 connected in a form of a string is referred to as a solar cell string.

Specifically, the adjacent solar cells 2 are overlapped such that an edge of a non-cut end 2c of one of the solar cells 2 on the convex-side main surface 2a side is in contact with the concave-side main surface 2b of the other solar cell 2 on the cut end 2d side. That is, the contact between the solar cells 2, 2 is made to be the edge of the non-cut end 2c of the solar cell 2, and the cut end 2d of the solar cell 2 is made to be non-contact. This can suppress a large load (local pressurizing stress) from being applied to the cut end 2d of the solar cell 2. Details will be described later.

The adjacent solar cells 2, 2 may be electrically connected by a known technique. An insulating member may be interposed between the adjacent solar cells 2, 2.

Here, as a method of half-cutting the solar cell 2, a laser scribing and breaking method can be exemplified. A groove (L1 in FIG. 3) is formed on the main surface of the solar cell by laser scribing, and the solar cell is cut along the groove (L1 in FIG. 3) by breaking. In this case, damage occurs relatively only on the surface on the breaking side in the cross section of the cut end, whereas on the laser scribing side, that is, the laser irradiated side, in the cross section of the cut end, damage due to laser irradiation occurs not only on the surface but also inside. For example, on the laser scribing side, that is, on the laser irradiated side, silicon is recrystallized not only on the surface but also in the inside, and thus recombination of carriers increases as compared with the breaking side.

As the method of half-cutting the solar cell 2, a crack growth method (Thermal Laser Separation) can be raised. The solar cell is scratched at the end and the main surface of the solar cell is heated by a laser (along L1 in FIG. 3), and then rapidly cooled (that is, by utilizing a local temperature difference), whereby cracks are developed and the solar cell is cut. In this case, the laser irradiation may cause damage not only on the surface but also in the inside, on the laser irradiated side in the cross section of the cut end. For example, as described above, on the laser irradiated side, silicon is recrystallized not only on the surface but also in the inside, and thus recombination of carriers increases.

Figure 4:
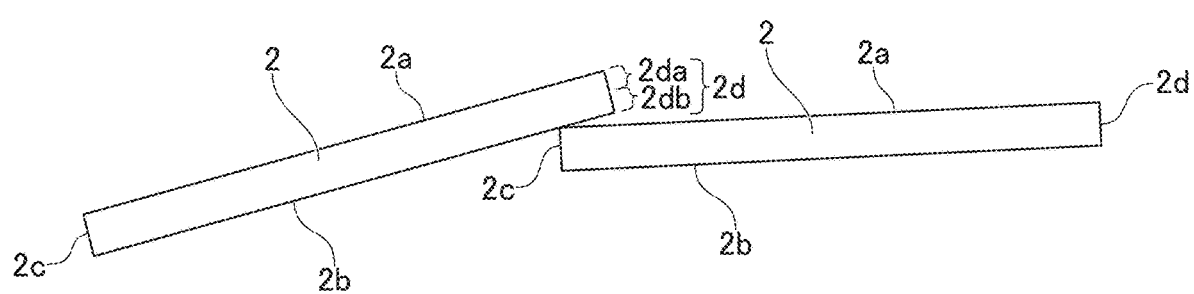
FIG. 4 is a side view of the solar cell shown in FIG. 1, and is a schematic diagram showing a portion irradiated with a laser and a portion not irradiated with a laser.

In this regard, as shown in FIG. 4, the cut end 2d of the solar cell 2 has, in the thickness direction, a laser irradiated portion 2db that has been irradiated with a laser when cut by half-cutting, and a non-laser irradiated portion 2da other than the laser irradiated portion 2db. The laser irradiated portion 2db is located on a concave-side main surface 2b side of the solar cell 2. This can suppress a decrease in photoelectric conversion efficiency of the solar cell 2 due to recombination of carriers in the laser irradiated portion 2db. Further, it is also preferable from the viewpoint of appearance.

Figure 5:
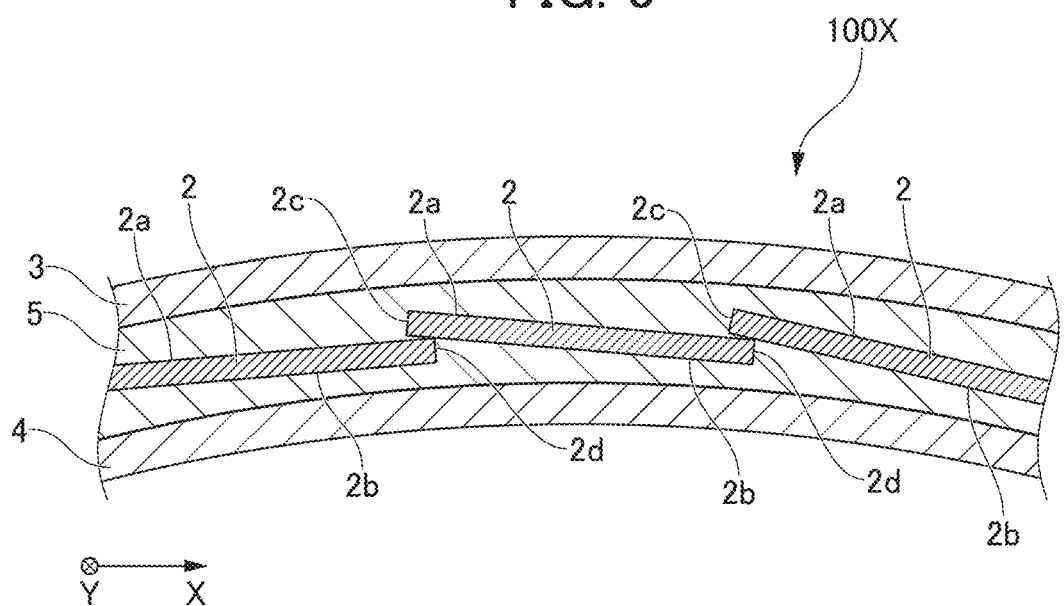
FIG. 5 is a cross-sectional view of a solar cell module according to a comparative example.

Here, FIG. 5 is a cross-sectional view showing a solar cell module 100X according to a comparative example. The solar cell module 100X of the comparative example differs from the solar cell module 100 of the present embodiment shown in FIG. 1 in the arrangement of the solar cells 2. Specifically, the adjacent solar cells 2 are overlapped so that an edge of the cut end 2*d* of one of the solar cells 2 on the convex-side main surface 2*a* side is in contact with the concave-side main surface 2*b* of the other solar cell 2 on the non-cut end 2*c* side. The shingling structure is opposite to that of FIG. 1. That is, the contact between the solar cells 2, 2 is made to be the edge of the cut end 2*d* of the solar cell 2.

When the flat solar cells 2 are arranged in a curved surface shape in the shingling structure as in the present embodiment or the comparative example, in the overlapping portions of the solar cells 2, 2, the solar cells do not contact in a surface contact, but contact locally on an edge alone, resulting in an increased thickness. Therefore, in the sealing process, a relatively large load (local pressurizing stress) is applied to the edge of the contact end of the overlapping portion of the solar cell 2. Further, in the half-cut solar cell 2, the cut end 2*d* has been damaged by laser irradiation, and potentially has microcracks, and thus cracks easily occur in the solar cell 2. Furthermore, the cut end 2*d* is likely to cause damage (for example, a scratch) to another cell.

Therefore, in the solar cell module 100X of the comparative example, when the half-cut flat solar cells 2 are formed into a curved surface shape in the shingling structure, only the edge of the cut end 2*d* of the solar cell 2 comes into local contact, and a relatively large load (local pressurizing stress) is applied to the cut end 2*d* in the sealing process, causing the solar cell 2 to be cracked in some cases. In addition, the cut end 2*d* may cause damage (for example, a scratch) to another cell.

In contrast, according to the solar cell module 100 of the present embodiment, the adjacent solar cells 2 are overlapped such that the edge of the non-cut end 2*c* of one of the solar cells 2 on the convex-side main surface 2*a* side is in contact with the concave-side main surface 2*b* of the other solar cell 2 on the cut end 2*d* side. That is, the contact between the solar cells 2, 2 is made to be the edge of the non-cut end 2*c* of the solar cell 2, and the cut end 2*d* of the solar cell 2 is made to be non-contact. Thus, according to the solar cell module 100 of the present embodiment, even when the half-cut flat solar cell 2 is formed into a curved surface shape in the shingling structure, the cut end 2*d* of the solar cell 2 is not in contact with the solar cell 2, and thus it is possible to suppress a large load (local pressurizing stress) from being applied to the cut end 2*d* in the sealing process, which suppresses the solar cell 2 from cracking. Further, this prevents the cut end 2*d* from damaging (for example, scratching) another cell.

As a result, it is possible to suppress a decrease in the output of the solar cell module due to cell cracking. In addition, in the modularization process in the manufacturing process, the yield due to influence of the cell cracking can be reduced. Further, it is possible to suppress a decrease in the long-term reliability of the solar cell module due to cell cracking. In addition, in long-term use, it is possible to suppress deterioration of the solar cells 2 and the solar battery module 100 due to sliding of the overlapping portions of the solar cells 2 caused by temperature change.

Figure 6:
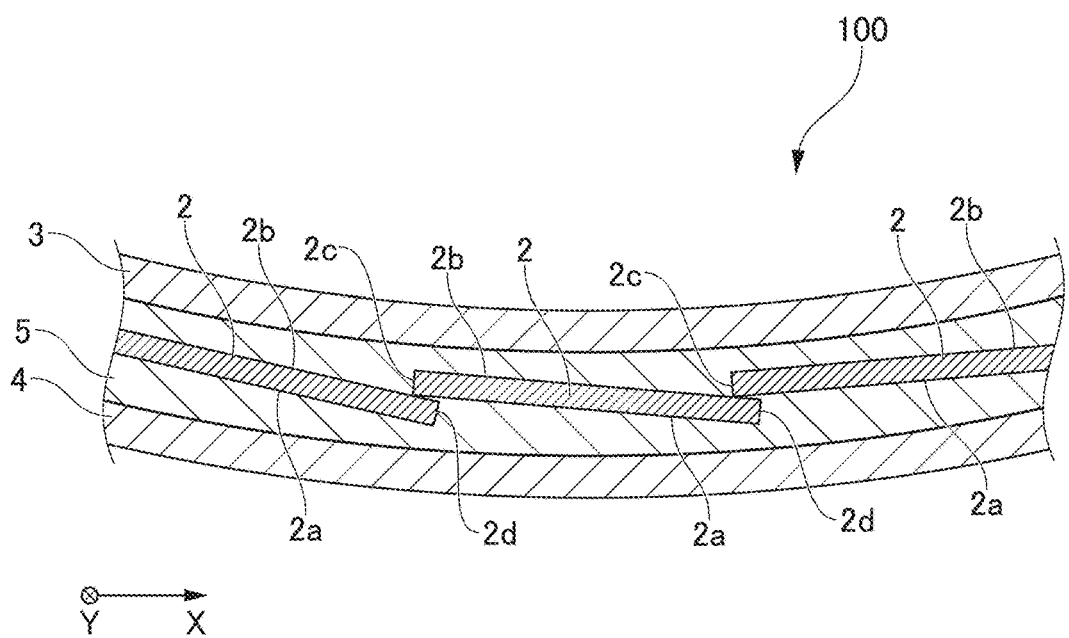
FIG. 6 is a cross-sectional view of a solar cell module according to a modification example of the present embodiment.

Although the embodiments of the present disclosure have been described above, the present disclosure is not limited to the above-described embodiments, and various changes and modifications can be made. For example, in the above-described embodiment, the solar cell module 100 having a curved surface shape that is convex on the light receiving surface side is exemplified. However, the present disclosure is not limited thereto, and can be applied to a solar cell module having a curved surface shape that is concave on the light receiving surface side. In this case, for example, as shown in FIG. 6, it is also sufficient for the adjacent solar cells 2, 2 to be overlapped such that the edge of the non-cut end 2*c* of one of the solar cells 2 on the convex-side main surface 2*a* side is in contact with the concave-side main surface 2*b* of the other solar cell 2 on the cut end 2*d* side. Even in this case, the laser irradiated portion 2*db* of the cut end 2*d* of the solar cell 2 may be located on the concave-side main surface 2*b* side of the solar cell 2.

What is claimed is:

1. A curved solar cell module, comprising:
 a plurality of flat solar cells arranged by a shingling method, wherein
 each of the plurality of solar cells is a half-cut cell obtained by cutting a substrate of a predetermined size into two pieces, each of the solar cells has a cut end and a non-cut end as two opposing ends in an arrangement direction of the plurality of solar cells, each of the solar cells has, as two main surfaces, a convex-side main surface on a convex side of a curved surface of the solar cell module and a concave-side main surface on a concave side of the curved surface of the solar cell module, and
 adjacent solar cells among the plurality of solar cells are overlapped such that an edge of the non-cut end of one of the solar cells on the convex-side main surface side is in contact with the concave-side main surface of the other solar cell on the cut end side.

2. The solar cell module according to claim 1, wherein the cut end of each of the solar cells has a laser irradiated portion that has been irradiated with a laser when cut by half-cutting, and a non-laser irradiated portion other than the laser irradiated portion, and
 the laser irradiated portion is on a concave-side main surface side of the solar cell.

* * * * *